United States Patent
Olson et al.

(10) Patent No.: US 7,358,510 B2
(45) Date of Patent: Apr. 15, 2008

(54) ION IMPLANTER WITH VARIABLE SCAN FREQUENCY

(75) Inventors: Joseph C. Olson, Beverly, MA (US); Morgan Evans, Manchester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 261 days.

(21) Appl. No.: 11/390,518

(22) Filed: Mar. 27, 2006

(65) Prior Publication Data

US 2007/0221872 A1    Sep. 27, 2007

(51) Int. Cl.
*H01J 37/08*    (2006.01)
(52) U.S. Cl. .............. 250/492.21; 250/492.1; 250/492.2; 250/492.3; 250/398; 250/396 R
(58) Field of Classification Search .............. None
See application file for complete search history.

(56) References Cited

U.S. PATENT DOCUMENTS

| 5,418,378 | A | * | 5/1995 | Friede et al. .......... 250/492.21 |
| 6,075,249 | A | | 6/2000 | Olson |
| 6,495,840 | B2 | | 12/2002 | Hamamoto et al. |
| 6,838,685 | B1 | | 1/2005 | Kodama et al. |
| 2002/0066872 | A1 | | 6/2002 | Nishihashi et al. |

FOREIGN PATENT DOCUMENTS

WO    WO 02/025692 A    3/2002

\* cited by examiner

*Primary Examiner*—Jack Berman
*Assistant Examiner*—Zia Hashmi

(57) ABSTRACT

An ion implanter includes an ion beam generator configured to generate an ion beam, a scanner configured to scan the ion beam in at least one direction at a scan frequency, and a controller. The controller is configured to control the scan frequency in response to an operating parameter of the ion implanter. The operating parameter is at least partially dependent on the energy of the ion beam. The scan frequency is greater than a scan frequency threshold if the energy is greater than an energy threshold, and the scan frequency is less than the scan frequency threshold if the energy is less than the energy threshold.

22 Claims, 6 Drawing Sheets

ION IMPLANTER WITH VARIABLE SCAN FREQUENCY

FIELD

This disclosure relates to ion implantation and, more particularly, to an ion implanter with a variable scan frequency.

BACKGROUND

Ion implantation is a standard technique for introducing conductivity—altering impurities into semiconductor wafers. A desired impurity material may be ionized in an ion source, the ions may be accelerated to form an ion beam of prescribed energy, and the ion beam may be directed at a front surface of the wafer. The energetic ions in the beam penetrate into the bulk of the semiconductor material and are embedded into the crystalline lattice of the semiconductor material to form a region of desired conductivity.

An ion implanter may include a scanner for deflecting or scanning the ion beam in at least one direction at a scan frequency in order to distribute the ion beam over the front surface of the wafer. The scanner may be an electrostatic scanner or a magnetic scanner as are known in the art. The ion beam may be distributed over the wafer area by the beam scanning alone or by a combination of beam scanning and wafer movement. In one ion implanter, the scanner may scan the beam in one direction and a drive system may translate the wafer in a direction orthogonal to the scan direction to distribute the ion beam over the front surface of the wafer.

Introducing the ions at a specified depth and density into the wafers, which may be a uniform depth and density, is important to ensure that the semiconductor device being formed operates within specification. One factor that can affect the uniformity of the dose into the wafer is the ion beam current. An unexpected fluctuation in ion beam current, e.g., a glitch, may degrade the resulting uniformity of the impurity dose. Accordingly, various ion beam current monitoring systems have been developed.

One conventional ion beam current monitoring system includes one or more Faraday sensors disposed about the perimeter of the wafer to monitor ion beam current as the scanned ion beam is scanned off the front surface of the wafer. When such a beam current monitoring system is utilized with a scanned ion beam, a relatively higher scan frequency would provide more frequent beam current measurements than a comparatively lower scan frequency. A relatively higher scan frequency would also provide more passes of the ion beam over the front surface of the wafer assuming a scan of the beam in one direction and a constant velocity of wafer movement in a direction orthogonal to the scan direction. More passes of the ion beam over the front surface of the wafer may assist with achieving dose uniformity goals for certain ion beams.

Therefore, a scanner in one conventional ion implanter uses a relatively higher scan frequency on the order of about 1 kilohertz (kHz). This higher scan frequency may be adjusted within a modest range about 1 kHz for dose uniformity purposes. This relatively higher scan frequency provides the aforementioned benefits for high energy ion beams. However, the higher scan frequency for low energy ion beams may not provide sufficient time for beam neutralization efforts. This may then lead to decreased beam current for the low energy ion beams, a decreased success rate for uniformity set up for low energy ion beams, and an increase in uniformity tune time during beam setup.

Accordingly, there is a need for an ion implanter with a variable scan frequency that enables a higher scan frequency to be utilized for high energy ion beams and a lower scan frequency to be utilized for low energy ion beams.

SUMMARY

According to a first aspect of the invention, an ion implanter is provided. The ion implanter includes an ion beam generator configured to generate an ion beam, a scanner configured to scan the ion beam in at least one direction at a scan frequency, and a controller. The controller is configured to control the scan frequency in response to an operating parameter of the ion implanter. The operating parameter is at least partially dependent on an energy of the ion beam. The scan frequency is greater than a scan frequency threshold if the energy is greater than an energy threshold, and the scan frequency is less than the scan frequency threshold if the energy is less than the energy threshold.

According to another aspect of the invention, a method is provided. The method includes generating an ion beam, scanning the ion beam in at least one direction at a scan frequency, and controlling the scan frequency in response to an operating parameter of the ion implanter, the operating parameter at least partially dependent on an energy of the ion beam, the scan frequency greater than a scan frequency threshold if the energy is greater than an energy threshold, the scan frequency less than the scan frequency threshold if the energy is less than the energy threshold.

BRIEF DESCRIPTION OF THE DRAWINGS

For a better understanding of the present disclosure, reference is made to the accompanying drawings, which are incorporated herein by reference and in which.

DETAILED DESCRIPTION

The invention is described herein in connection with an ion implanter. However, the invention can be used with other systems and processes that use beams of energetic charged particles, such as electron beam imaging systems. Thus, the invention is not limited to the specific embodiments described below.

Figure 1:
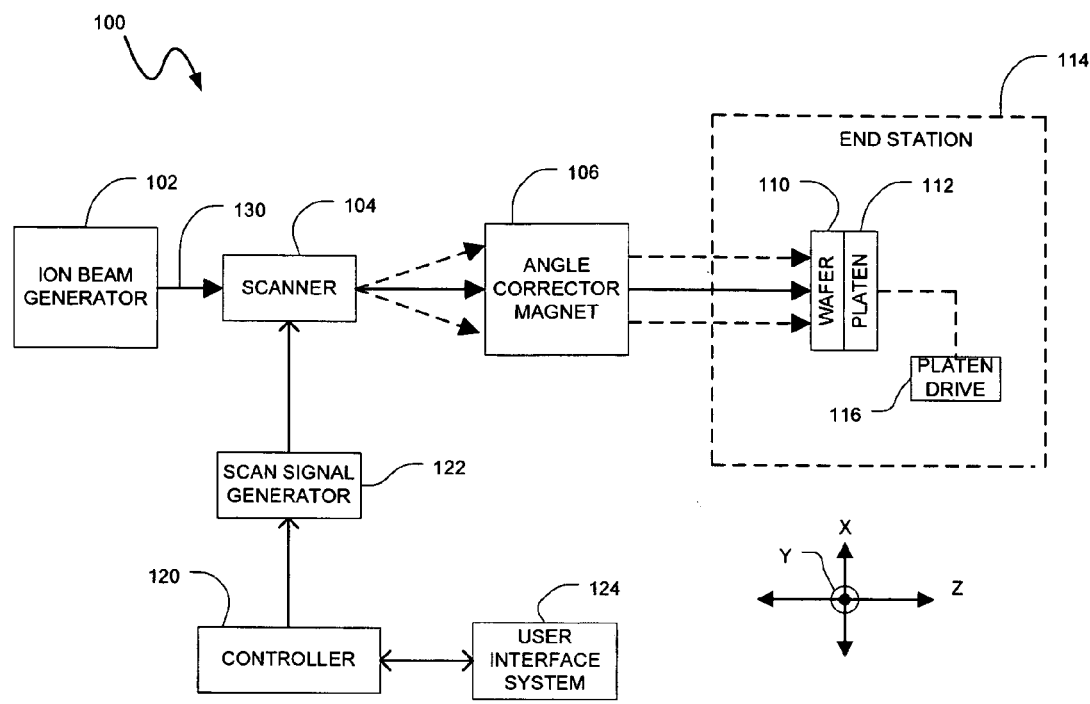
FIG. 1 is a schematic block diagram of an ion implanter.

FIG. 1 illustrates a block diagram of an ion implanter 100 including an ion beam generator 102, a scanner 104, a scan signal generator 122, an angle corrector magnet 106, an end station 114, a controller 120, and a user interface system 122. The ion beam generator 102 can include various types of components and systems to generate an ion beam 130 having desired characteristics. The ion beam 130 may be a spot beam and the spot beam may have an approximately circular cross-section of a particular diameter depending on, at least, the energy of the ion beam 130. The cross sectional size of the ion beam incident on the wafer 110 may become increasingly larger at low beam energies due to space charge effects. The ion beam 130 generated by the ion beam generator 102 can be any type of charged particle beam.

The scanner 104 may deflect or scan the ion beam in at least one direction at a scan frequency in order to distribute the ion beam over the front surface of the wafer 110. The scanner 104 may be an electrostatic scanner or a magnetic scanner. An electrostatic scanner may include one or more sets of scan electrodes in the form of scan plates that may be spaced apart to define a gap.

The ion beam 130 may be directed through the gap and may be deflected by an electric field in the gap. The electric field may be produced in response to a voltage scan signal provided by the scan signal generator 122 to the scan plates of the electrostatic scanner. The scan frequency of the electrostatic scanner may be varied by controlling the voltage signal provided to the scan plates. A magnetic scanner may include magnetic polepieces and a coil that constitute an electromagnet. The magnetic polepieces may be spaced apart to define a gap. The ion beam 130 may be directed through the gap and may be deflected by a magnetic field in the gap. The magnetic field may be produced in response to a current scan signal provided by the scan signal generator 122 to the coil of the magnetic scanner. The scan frequency of the magnetic scanner may be varied by controlling the current signal provided to the coil.

The scan signal generator 122 may provide scan signals. In the case of an electrostatic scanner, the scan signal may be a voltage signal. In the case of a magnetic scanner, the scan signal may be a current signal. The controller 120 may control the scan signal provided by the scan signal generator 122.

The angle corrector magnet 106 may deflect ions of the desired ion species of the ion beam 130 to convert diverging ion beam paths from the scanner 104 to nearly collimated ion beam paths having substantially parallel ion path trajectories.

The end station 114 may support one or more wafers in the path of the ion beam 130 such that ions of the desired species are implanted into the wafer 110. The wafer 110 may be supported by a platen 112. The wafer 110 can take various physical shapes such as a common disk shape. The wafer 110 can be a semiconductor wafer fabricated from any type of semiconductor material such as silicon or any other material that is to be implanted using the ion beam 130.

The end station 114 may include a wafer drive system (not illustrated) to physically move the wafer 110 to and from the platen 112 from holding areas. The wafer 110 may be clamped to the platen 112 using known techniques such as electrostatic wafer clamping. The end station 114 may also include a platen drive system 116 to drive the platen 112 and hence the wafer 110 clamped to the platen 112 in a desired way. For example, the platen drive 116 may include servo drive motors, screw drive mechanisms, mechanical linkages, and any other components as are known in the art.

In one ion implanter, the scanner 104 may scan the ion beam 130 in one direction and the platen drive 116 may physically move the wafer 110 in a direction orthogonal to the scan direction to distribute the ion beam 130 over the front surface of the wafer 110. In one example, the scan direction may be in the horizontal X direction as defined by the coordinate system of FIG. 1, while the platen drive 116 may translate the wafer vertically in the Y direction as also defined by the coordinate system of FIG. 1.

The controller 120 may receive input data and instructions from any variety of systems and components of the ion implanter 100 and provide output signals to control the components of the ion implanter 100 such as the scanner 104. For clarity of illustration, the controller 120 is illustrated as providing only an output signal to the scan signal generator 122. Those skilled in the art will recognize that the controller 120 may provide output signals to each component of the ion implanter 100 and receive input signals from the same. The controller 120 can be or include a general-purpose computer or network of general-purpose computers that may be programmed to perform desired input/output functions. The controller 120 can also include other electronic circuitry or components, such as application specific integrated circuits, other hardwired or programmable electronic devices, discrete element circuits, etc. The controller 120 may also include communication devices, data storage devices, and software.

A user interface system 124 may include, but not be limited to, devices such as touch screens, keyboards, user pointing devices, displays, printers, etc. to allow a user to input commands and/or data and/or to monitor the ion implanter 100 via the controller 120. Desired beam energy, beam current, ion species, etc. of an implant may be input by a user via the user interface system 124.

In operation, the ion beam generator 102 is configured to generate an ion beam 130, and the scanner 104 is configured to scan the ion beam in at least one direction at a scan frequency. The controller 120 is configured to control the scan frequency in response to an operating parameter of the ion implanter. The operating parameter is at least partially dependent on the energy of the ion beam. In one instance, the operating parameter may be a desired energy of the ion beam input to the ion implanter 100 by a user via the user interface 124. In another instance, the operating parameter may be an operating mode of the ion beam. For example, one operating mode may be a deceleration mode that transports the ion beam at a high energy and then decelerates the ion beam to a low energy ion beam at a point in the beam line before implantation. In this way, transporting a low energy ion beam long distances may be avoided and so such an operating mode may be indicative of a low energy ion beam.

In yet another instance, the operating parameter may be a charge state of an ion of the ion beam. The charge state of the ion beam may be a singly charged ion since a low energy beam almost always runs only singly charged ions. Doubly and triply charged ions do not usually need additional neutralization because the beam current and density are so low. In yet another instance, the operating parameter may be beam current density. In yet another instance, the operating parameter may depend on a combination of the energy of the ion beam and a beam current of the ion beam. For example, a low energy ion beam with a high current may benefit from a lower scan frequency, while a low energy ion beam with a low current may not.

Figure 2:
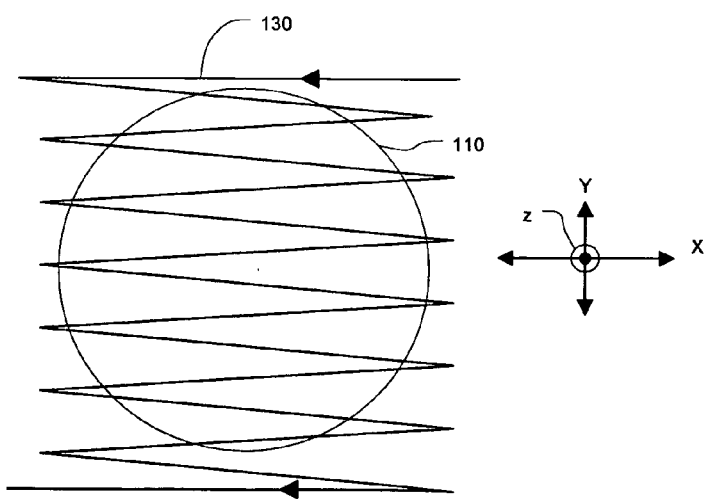
FIG. 2 is a schematic representation of one scan pattern on the wafer of FIG. 1.

FIG. 2 illustrates a schematic diagram of one scan pattern of the ion beam 130 on the front surface of the wafer 110 at a scan frequency. To distribute the ion beam uniformly across the surface of the wafer 110, the scanner 104 may scan the ion beam 130 in the horizontal X direction while the platen drive 116 translates the wafer 110 in the vertical Y direction to form the illustrated zig-zag shaped scanned pattern. If the platen drive 116 translates the wafer in the Y direction at a constant velocity, the number of passes of the scanned ion beam 130 across the front surface of the wafer 110 is dependent on the scan frequency of the scanner 104. For example, a higher scan frequency will result in a greater number of passes than a comparatively lower scan frequency.

Figure 3:
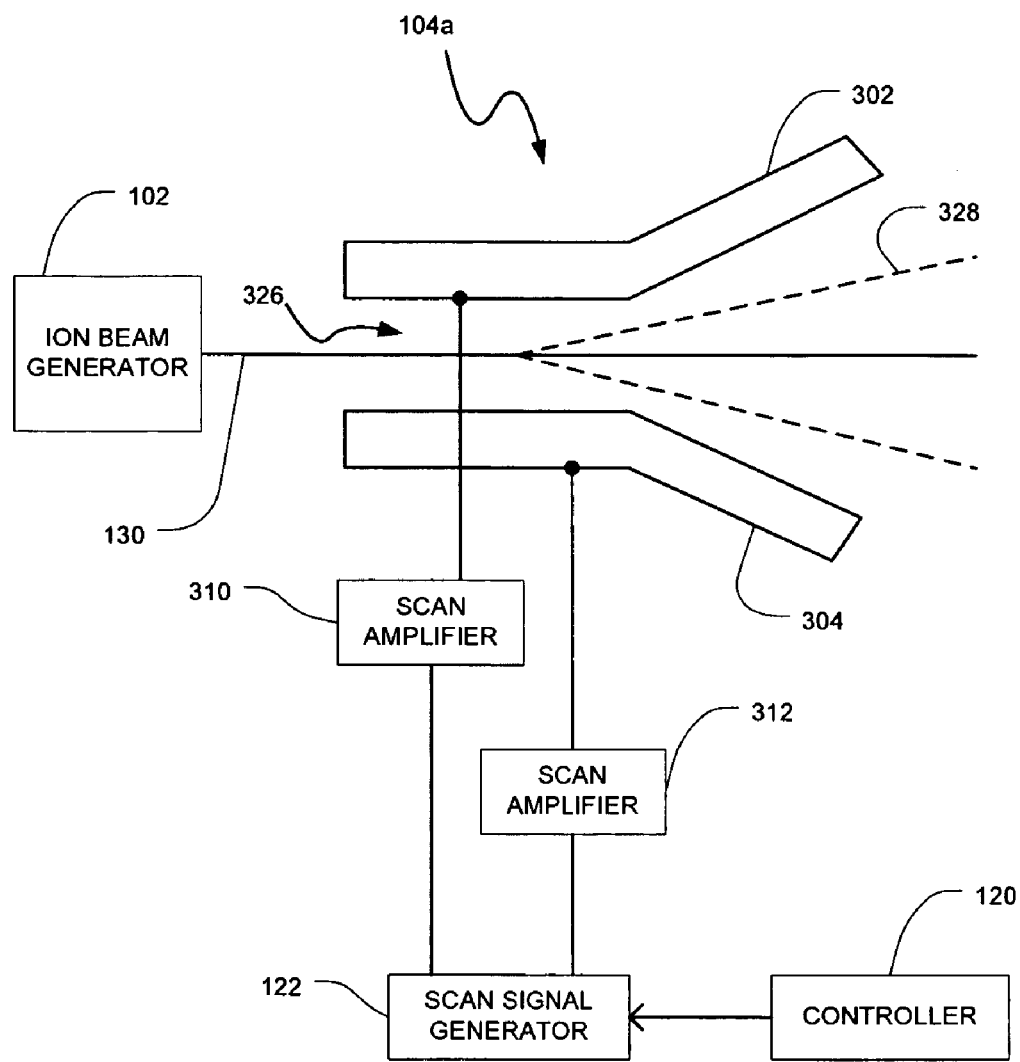
FIG. 3 is a schematic diagram of an electrostatic scanner.

Turning to FIG. 3, an embodiment of an electrostatic scanner 104a that may be utilized as the scanner 104 of FIG. 1 is illustrated. The electrostatic scanner 104a may have a set of scan electrodes in the form of scan plates 302, 304 positioned on opposite sides of the ion beam 130. Additional electrodes (not illustrated) such as a prescan electrode positioned upstream of the scan plates 302, 304 and a postscan electrode positioned downstream of the scan plates 302, 304 may also be present. As used herein, "upstream" and "downstream" are referenced in the direction of ion beam transport.

The scan plates 302, 304 may be spaced apart to define a gap 326. The ion beam 130 may be directed through the gap 326 and a fan-shaped beam envelope 328 of the ion beam 130 may increase in width as it passes through the gap 326. Scan plate 302 may be connected to scan amplifier 310 and scan plate 304 may be connected to scan amplifier 312. Scan amplifiers 310, 312 may receive a voltage signal from the scan signal generator 122. The scan signal generator 122 may be controlled by the controller 120.

In order to adjust the scan frequency of the electrostatic scanner 104a, the scan signal generator 122 may receive a digital description of the desired scan frequency from the controller 120. The scan signal generator 122 may generate a voltage signal that may be amplified by the scan amplifiers 310, 312 and applied to the scan plates 302, 304 to create the desired electric field in the gap 326 to deflect or scan the ion beam 130. The voltage signal from the scan signal generator 122 may have different amplitudes, frequencies, and waveforms to adjust the scan frequency. In one embodiment, the voltage signal may have a sawtooth waveform and the scan frequency may be adjusted by adjusting the amplitude of the signal and the slope between the peak-to-peak voltages of the signal.

Figure 4:
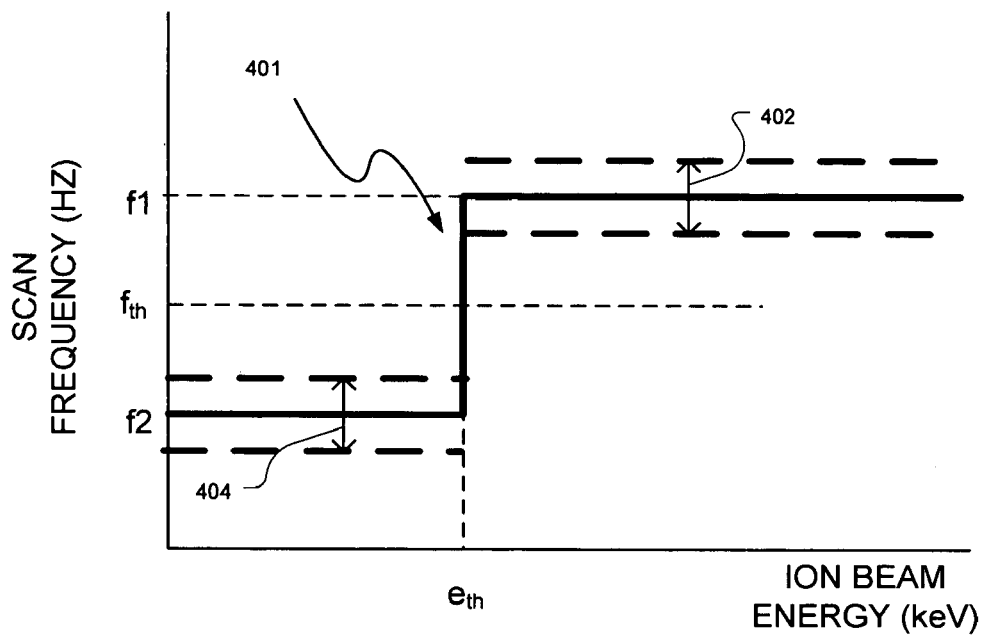
FIG. 4 is a plot of scan frequency versus ion beam energy for one embodiment.

FIG. 4 is a plot 401 of scan frequency versus ion beam energy for one embodiment to illustrate how the scan frequency of the scanner 104 of FIG. 1 may vary with the energy of the ion beam 130. The scan frequency may be greater than a scan frequency threshold ($f_{th}$) if the energy of the ion beam 130 is greater than an energy threshold ($e_{th}$). In addition, the scan frequency may also be less than the scan frequency threshold ($f_{th}$) if the energy of the ion beam 130 is less than the energy threshold ($e_{th}$). In one embodiment, the energy threshold ($e_{th}$) may be between about 1 and 50 kiloelectronvolt (keV). In another instance, the energy threshold ($e_{th}$) may be about 30 keV. The scan frequency threshold ($f_{th}$) may be about 500 Hertz in one embodiment.

In the embodiment illustrated in FIG. 4, the scan frequency may be a first scan frequency (f1) for an energy of the ion beam 130 greater than the energy threshold ($e_{th}$) and a second scan frequency (f2) for an energy less than the energy threshold ($e_{th}$). Although the first scan frequency (f1) and the second scan frequency (f2) are illustrated as fixed for those energies greater than and less than the energy threshold ($e_{th}$), the first and second scan frequencies may also vary about a range in response to uniformity tuning as illustrated by arrows 402 and 404.

The second scan frequency (f2) may be an order of magnitude less than the first scan frequency (f1). In one instance, the second scan frequency (f2) may be at least three times less than the first scan frequency (f1). In another example, the first scan frequency may be about 1 kiloHertz (kHz) and the second frequency may be about 250 Hertz.

Reducing the scan frequency of the scanner 104 for low energy ion beams, e.g., for ion beams having an energy less than the energy threshold ($e_{th}$), by an order of magnitude from the higher scan frequency enables a neutralizing system of the ion implanter 100 to have a similar order of magnitude longer to neutralize the low energy ion beam. For instance, the angle corrector magnet 106 may have a background gas that when ionized is better at neutralizing the ion beam. The background gas may have a first time interval to neutralize the ion beam along a path through the corrector magnet 106 if the scan frequency is greater than the scan frequency threshold and a second time interval to neutralize the ion beam if the scan frequency is less than the scan frequency threshold. The second time interval may be at least three times longer than the first time interval in response to a corresponding reduction in the scan frequency.

Figure 5:
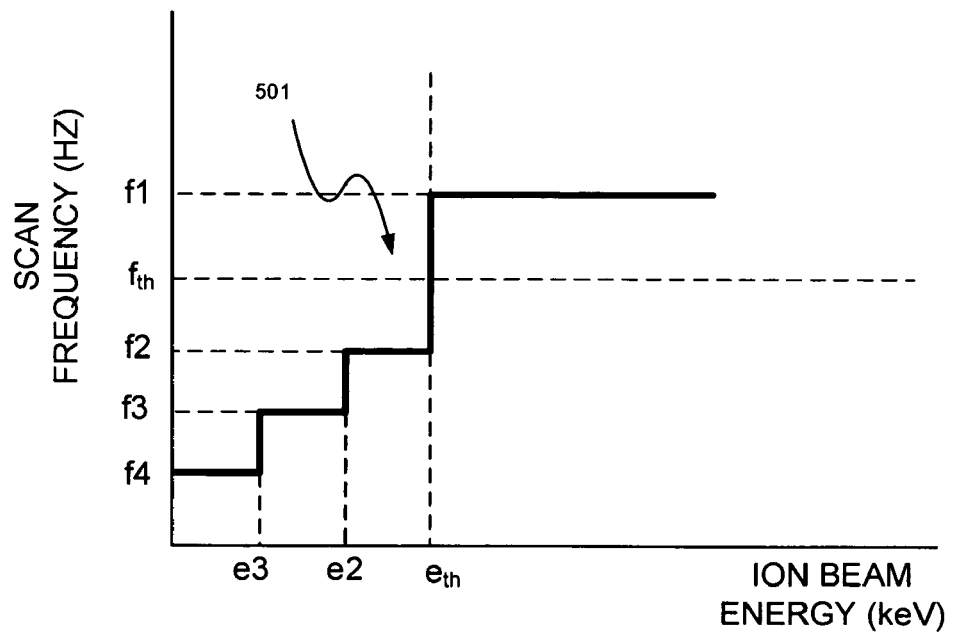
FIG. 5 is a plot of scan frequency versus ion beam energy for another embodiment illustrating a step wise reduction in scan frequency over certain frequencies.

Turning to FIG. 5, another plot 501 of scan frequency versus ion beam energy for another embodiment is illustrated to show how the scan frequency of the scanner 104 of FIG. 1 may vary with the energy of the ion beam 130. For energy less than the energy threshold ($e_{th}$), the controller 120 may decrease the scan frequency of the scanner 104 in a step wise fashion. For example, for energies less than the energy threshold but greater than a second energy (e2), the scan frequency may be at a second scan frequency (f2). For energies less then the second energy (e2) but greater than a third energy (e3), the scan frequency may be at a third scan frequency (f3), and so on. Although only three steps are shown for clarity, the step wise reduction in scan frequency may contain any plurality of steps at differing magnitude variations between each step. Similar to the embodiment of FIG. 4, although illustrated as fixed frequencies over associated energy ranges, the frequency level may vary about a range in response to uniformity tuning.

Figure 6:
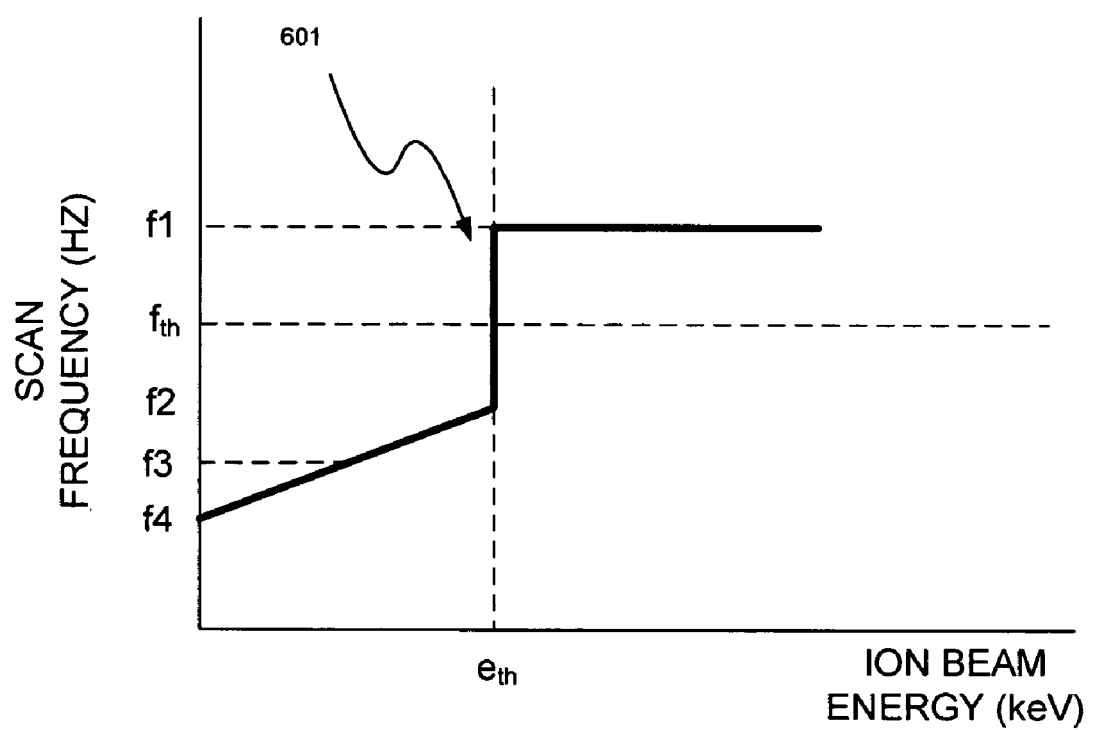
FIG. 6 is a plot of scan frequency versus ion beam energy for yet another embodiment illustrating a linear reduction in scan frequency over certain frequencies.

Turning to FIG. 6, yet another plot 601 of scan frequency versus ion beam energy is illustrated. Compared to the embodiment of FIG. 5, the controller 120 may decrease the scan frequency of the scanner 104 in a linear fashion for energies less than the energy threshold ($e_{th}$).

Figure 7:
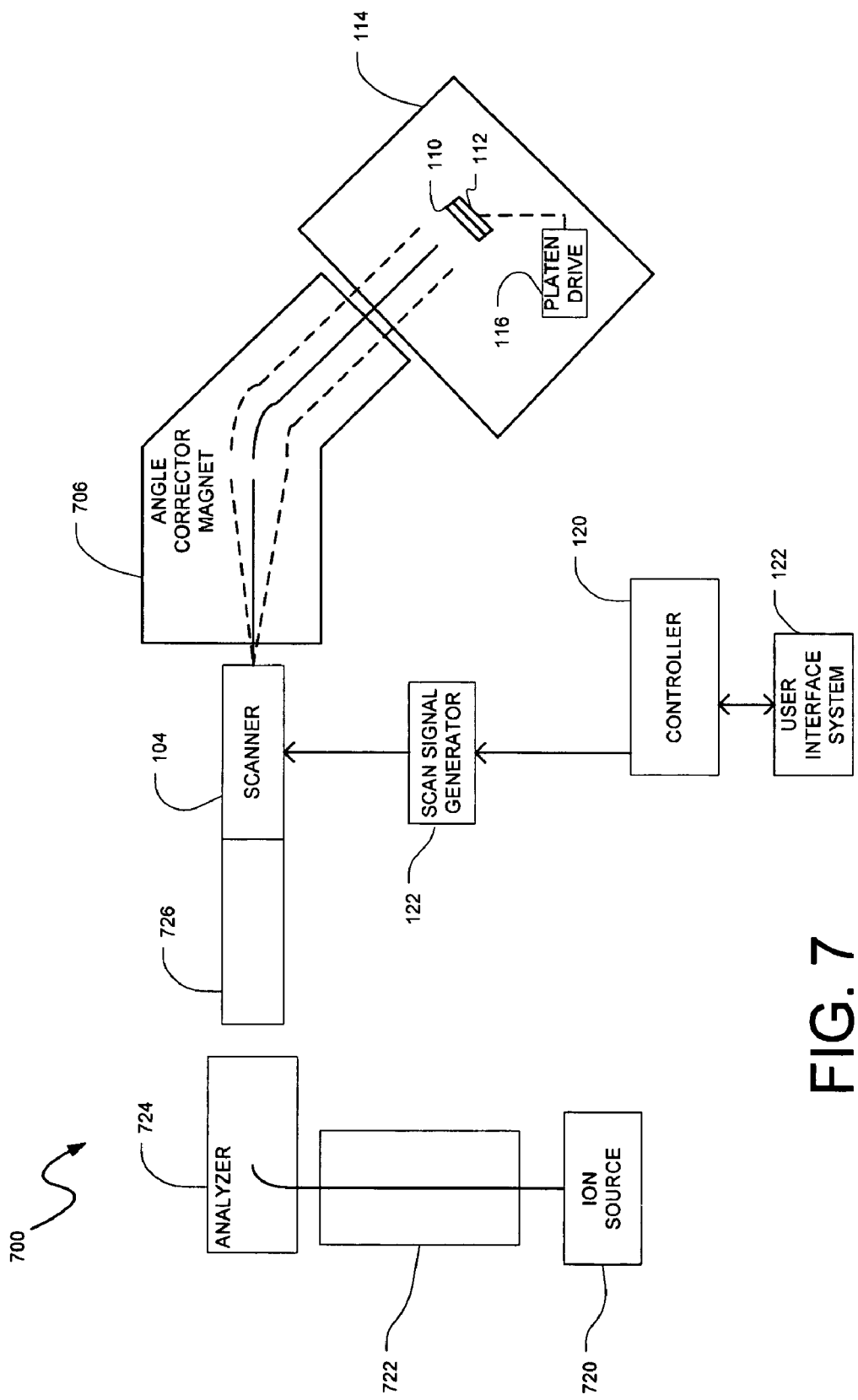
FIG. 7 is a schematic block diagram of one embodiment of the ion implanter of FIG. 1.

Turning to FIG. 7, a block diagram of one embodiment of an ion implanter 700 is illustrated. Many other ion implanters will be known to those skilled in the art and the embodiment of FIG. 7 is provided by way of example only and is not intended to be limiting. Components of FIG. 7 similar to components of FIG. 1 are similarly labeled and hence any repetitive description is omitted herein for clarity. The ion implanter 700 may include an ion source 720, an extraction electrode 722, a mass analyzer 724, a resolving aperture 726, a scanner 104, an angle corrector magnet 706, an end station 114, the controller 120, the scan signal generator 122, and the user interface system 122. The scanner 104 of the ion implanter 700 may be controlled similarly to that earlier detailed with respect to FIG. 1. The scanner 104 may also be implemented as an electrostatic scanner 104a as detailed in FIG. 3.

The ion source 720 may generate ions and may include an ion chamber and a gas box containing a gas to be ionized. The gas may be supplied to the ion chamber where it is to be ionized. The ions thus formed may be extracted from the ion source 720. The extraction electrode 722 and an extraction power supply may accelerate ions from the ion source. The extraction power supply may be adjustable as controlled by the controller 120. The construction and operation of ion sources are well known to those skilled in the art.

The mass analyzer 724 may include a resolving magnet that deflect ions so that ions of a desired species pass through the resolving aperture 726 and undesired species do not pass through the resolving aperture 726. In one embodiment, the mass analyzer 724 may deflect ions of the desired species by 90 degrees. The scanner 104 may be positioned downstream from the resolving aperture 726 to scan the ion beam in at least one direction. The angle corrector magnet 706 may deflect ions of the desired ion species to convert a diverging ion beam to a nearly collimated ion beam having substantial parallel ion trajectories. In one embodiment, the angle corrector magnet 706 may deflect ions of the desired ion species by 45 degrees.

Figure 8:
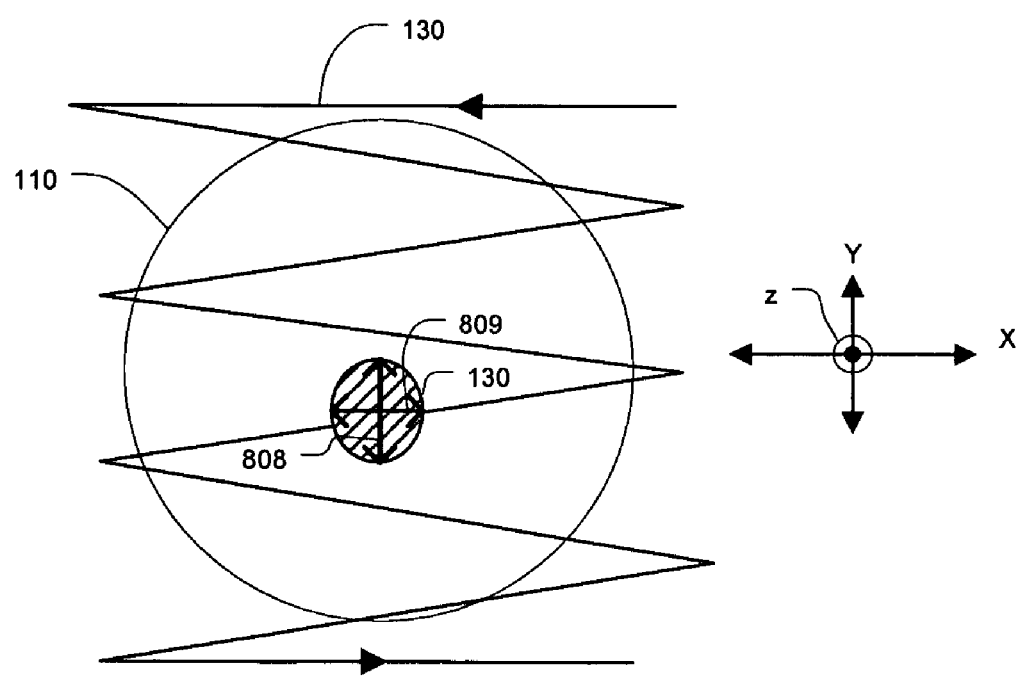
FIG. 8 is a schematic representation of another scan pattern on a wafer for a low energy ion beam.

FIG. 8 illustrates a schematic diagram of another scan pattern of the ion beam 130 on the wafer 110. The scan frequency resulting in the scan pattern of FIG. 8 may be less than the scan frequency threshold ($f_{th}$) in response to a low energy ion beam having an energy less than the energy threshold ($e_{th}$). In one embodiment, the energy threshold may be 30 keV.

At these low energy levels, the ion beam 130 may begin to spread due to the space charge effect. The ion beam 130 may initially have an approximately circular cross section that may begin to enlarge at low energies. The resulting cross sectional pattern incident on the wafer 110 may therefore have an approximately elliptical geometry as illustrated with axes 808 and 809. Both axes 808 and 809 will typically be larger as the beam energy decreases. The axis 809 may be 2 centimeters (cm) for high energy beams and may be 10 cm or more for very low energy beams. Similarly, the axis 808 may be 2 cm for high energy beams and may be 10 cm or more for very low energy beams. Because the axis 808 of the ion beam may be sufficiently large for low energy beams, a reduced scan frequency of the scanner 104 still enables the ion beam 130 to sufficiently cover the front surface of the wafer 110 to comply with dose uniformity requirements. The resulting cross sectional pattern of the ion beam 130 incident on the wafer 110 may also have other geometries all of which may further be affected by how and when the ion beam 130 is clipped along its path.

Advantageously, the scan frequency of the scanner 104 of the ion implanter may be adjusted to retain a higher scan frequency for high energy ion beams and may be adjusted to a lower scan frequency for low energy ion beams that are in need of additional time for charge neutralization. This higher scan frequency enables an ion implanter to preserve the benefits of the higher scan frequency for high energy beams such as better ion beam current detection and additional passes of the ion beam over the front surface of the wafer to assist with achieving uniformity goals. In addition, the scan frequency may be slowed for some low energy ion beams to enable adequate time intervals for charge neutralization efforts on those low energy beams. This may lead to increased beam current for low energy ion beams. The natural beam spreading for low energy ion beams due to the space charge effect enables uniformity goals to still be met even with a lower scan frequency. This may then lead to an increased success rate for uniformity set up for low energy ion beam and a decrease in uniformity tune time during beam setup.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting.

What is claimed is:

1. An ion implanter comprising:
    an ion beam generator configured to generate an ion beam;
    a scanner configured to scan said ion beam in at least one direction at a scan frequency; and
    a controller configured to control said scan frequency in response to an operating parameter of said ion implanter, said operating parameter at least partially dependent on an energy of said ion beam, said scan frequency greater than a scan frequency threshold if said energy is greater than an energy threshold, said scan frequency less than said scan frequency threshold if said energy is less than said energy threshold.

2. The ion implanter of claim 1, wherein said scanner comprises an electrostatic scanner.

3. The ion implanter of claim 2, wherein said electrostatic scanner comprises a set of scan electrodes spaced apart to define a gap, said ion beam directed through said gap, said controller configured to control said scan frequency by varying a voltage signal provided to said set of scan electrodes.

4. The ion implanter of claim 1, wherein said energy threshold is between about 1 kiloelectronvolt (keV) and about 50 keV.

5. The ion implanter of claim 1, wherein said scan frequency threshold is about 500 Hertz.

6. The ion implanter of claim 1, wherein said scan frequency is a first scan frequency for said energy greater than said energy threshold and a second scan frequency for said energy less than said energy threshold, said second scan frequency at least three times less than said first scan frequency.

7. The ion implanter of claim 6, wherein said first scan frequency is about 1 kiloHertz (kHz) and said second scan frequency is about 250 kHz.

8. The ion implanter of claim 1, wherein said controller decreases said scan frequency in a step wise fashion for energies less than said energy threshold.

9. The ion implanter of claim 1, wherein said controller decreases said scan frequency in a linear fashion for energies less than said energy threshold.

10. The ion implanter of claim 1, wherein said scan frequency is about 1 kiloHertz (kHz) if said energy is greater than said energy threshold and said scan frequency is about 250 Hertz if said energy is less than said energy threshold, said energy threshold being about 30 keV.

11. The ion implanter of claim 1, further comprising an angle corrector magnet having background gas, said background gas having a first time interval to neutralize said ion beam along a path through said angle corrector magnet if said scan frequency is greater than said scan frequency threshold, said background gas having a second time interval to neutralize said ion beam along said path is said scan frequency is less than said scan frequency threshold, said second time interval greater than said first time interval.

12. The ion implanter of claim 11, wherein said second time interval is at least three times greater than said first time interval.

13. The ion implanter of claim 1, wherein said operating parameter comprises an operating mode of said ion implanter.

14. The ion implanter of claim 1, wherein said operating parameter comprises a charge state of an ion of said ion beam.

15. The ion implanter of claim 1, wherein said operating parameter is also at least partially dependent on a beam current of said ion beam.

16. A method comprising:
    generating an ion beam;
    scanning said ion beam in at least one direction at a scan frequency; and
    controlling said scan frequency in response to an operating parameter, the operating parameter at least partially dependent on an energy of said ion beam, said scan frequency greater than a scan frequency threshold if said energy is greater than an energy threshold, said scan frequency less than said scan frequency threshold if said energy is less than said energy threshold.

17. The method of claim 16, wherein said energy threshold is between about 1 keV and about 50 keV.

18. The method of claim 16, wherein said scan frequency threshold is about 500 Hertz.

19. The method of claim 16, wherein said controlling said scan frequency comprises decreasing said scan frequency in a step wise fashion for energies less than said energy threshold.

20. The method of claim 16, wherein said scan frequency is about 1 kiloHertz (kHz) if said energy is greater than said energy threshold and said scan frequency is about 250 Hertz if said energy is less than said energy threshold, said energy threshold being about 30 keV.

21. The method of claim 16, wherein said scan frequency is a first scan frequency for said energy greater than said energy threshold and a second scan frequency for said energy less than said energy threshold, said second scan frequency at least three times less than said first scan frequency.

22. The method of claim 21, wherein a neutralizing system has a first time interval to neutralize said ion beam along a path through an angle corrector magnet at said first scan frequency, and wherein said neutralizing system has a second time interval to neutralize said ion beam along said path through said angle corrector magnet at said second scan frequency, said second time interval at least three times greater than said first time interval.

* * * * *